United States Patent
Ghosh et al.

(10) Patent No.: US 12,374,864 B2
(45) Date of Patent: *Jul. 29, 2025

(54) PRODUCING ILLUMINATION BEAMS USING MICRO-LENS ARRAYS

(71) Applicant: ams Sensors Asia Pte. Ltd., Singapore (SG)

(72) Inventors: Chuni Ghosh, West Windsor, NJ (US); Jean-Francois Seurin, Princeton Junction, NJ (US); Laurence Watkins, Pennington, NJ (US); Baiming Guo, Old Bridge, NJ (US); Markus Rossi, Jona (CH)

(73) Assignee: AMS SENSORS ASIA PTE. LTD., Singapore (SG)

( * ) Notice: Subject to any disclaimer, the term of this patent is extended or adjusted under 35 U.S.C. 154(b) by 1053 days.

This patent is subject to a terminal disclaimer.

(21) Appl. No.: 17/278,511

(22) PCT Filed: Sep. 23, 2019

(86) PCT No.: PCT/SG2019/050483
§ 371 (c)(1),
(2) Date: Mar. 22, 2021

(87) PCT Pub. No.: WO2020/067995
PCT Pub. Date: Apr. 2, 2020

(65) Prior Publication Data
US 2022/0037856 A1    Feb. 3, 2022

Related U.S. Application Data

(60) Provisional application No. 62/735,367, filed on Sep. 24, 2018.

(51) Int. Cl.
*H01S 5/183*    (2006.01)
*G01B 11/24*    (2006.01)
(Continued)

(52) U.S. Cl.
CPC .......... *H01S 5/18388* (2013.01); *G01B 11/24* (2013.01); *G01S 7/4815* (2013.01);
(Continued)

(58) Field of Classification Search
CPC ............. H01S 5/18388; H01S 5/02253; H01S 5/18305; H01S 5/18386; H01S 5/423;
(Continued)

(56) References Cited

U.S. PATENT DOCUMENTS

| 3,438,200 A | 4/1969 | Jennings et al. |
| 7,502,176 B2 | 3/2009 | Mino et al. |

(Continued)

FOREIGN PATENT DOCUMENTS

| CN | 1651972 A | 8/2005 |
| CN | 104022433 A | 9/2014 |

(Continued)

OTHER PUBLICATIONS

International Search Report for the Application No. PCT/IB2019/001014 dated Jan. 28, 2020 (12 pages).

(Continued)

*Primary Examiner* — Isam A Alsomiri
*Assistant Examiner* — Joseph C Fritchman
(74) *Attorney, Agent, or Firm* — VIERING, JENTSCHURA & PARTNER mbB

(57) ABSTRACT

A device includes an illumination device for emitting an illumination beam. The illumination device includes an emitter array including multiple light emitters; and a micro-lens array (MLA) including multiple micro-lenses. The MLA is positioned to receive light emitted from the emitter array. Light from the MLA forms the illumination beam. A first region of the MLA is offset from the emitter array by a (Continued)

first offset amount, and a second region of the MLA is offset from the emitter array by a second offset amount different than the first offset amount.

22 Claims, 10 Drawing Sheets

(51) Int. Cl.
| | |
|---|---|
| *G01S 7/481* | (2006.01) |
| *G01S 17/89* | (2020.01) |
| *G02B 3/00* | (2006.01) |
| *G02B 19/00* | (2006.01) |
| *H01S 5/02253* | (2021.01) |
| *H01S 5/42* | (2006.01) |
| *H04N 23/56* | (2023.01) |

(52) U.S. Cl.
CPC ............ *G01S 17/89* (2013.01); *G02B 3/0006* (2013.01); *G02B 19/0057* (2013.01); *H01S 5/02253* (2021.01); *H01S 5/18305* (2013.01); *H01S 5/18386* (2013.01); *H01S 5/423* (2013.01); *H04N 23/56* (2023.01)

(58) Field of Classification Search
CPC . H01S 5/0207; G02B 3/0006; G02B 19/0057; G02B 19/0066; G06V 20/64; G06V 40/172; H04N 13/207; H04N 23/56
See application file for complete search history.

(56) References Cited

U.S. PATENT DOCUMENTS

| | | | | |
|---|---|---|---|---|
| 8,761,594 | B1* | 6/2014 | Gross | G01S 7/4817 |
| | | | | 396/155 |
| 9,048,633 | B2 | 6/2015 | Gronenborn et al. | |
| 9,273,846 | B1 | 3/2016 | Rossi et al. | |
| 9,946,089 | B2 | 4/2018 | Chen et al. | |
| 10,855,055 | B2 | 12/2020 | Bloemen et al. | |
| 11,512,836 | B2 | 11/2022 | Rossi et al. | |
| 2004/0233964 | A1 | 11/2004 | Yamanaka et al. | |
| 2007/0071056 | A1 | 3/2007 | Chen | |
| 2008/0310186 | A1* | 12/2008 | Chari | B29D 11/00365 |
| | | | | 264/1.32 |
| 2011/0254763 | A1 | 10/2011 | Lee et al. | |
| 2013/0272330 | A1 | 10/2013 | Joseph et al. | |
| 2014/0247841 | A1 | 9/2014 | Seurin et al. | |
| 2014/0269796 | A1* | 9/2014 | Geske | H01S 5/4087 |
| | | | | 372/34 |
| 2016/0164261 | A1 | 6/2016 | Warren | |
| 2016/0352073 | A1* | 12/2016 | Dummer | H01S 5/40 |
| 2017/0097274 | A1* | 4/2017 | Thorpe | G01C 15/00 |
| 2017/0115447 | A1 | 4/2017 | Miyamoto | |
| 2017/0207374 | A1 | 7/2017 | Gubser et al. | |
| 2017/0370554 | A1* | 12/2017 | MacKinnon | H01S 5/18386 |
| 2018/0129013 | A1* | 5/2018 | Balimann | G02B 19/0014 |
| 2018/0150695 | A1* | 5/2018 | Guttmann | G06V 20/40 |
| 2018/0259645 | A1* | 9/2018 | Shu | G01S 7/4865 |
| 2019/0243155 | A1 | 8/2019 | You et al. | |
| 2020/0025893 | A1 | 1/2020 | Jang et al. | |
| 2020/0194975 | A1 | 6/2020 | Gronenborn et al. | |

FOREIGN PATENT DOCUMENTS

| | | |
|---|---|---|
| DE | 6608740 U | 11/1971 |
| KR | 101275388 B1 | 6/2013 |
| WO | 9740558 A1 | 10/1997 |
| WO | 02/05397 A2 | 1/2002 |
| WO | 2018063220 A1 | 4/2018 |

OTHER PUBLICATIONS

International Preliminary Report on Patentability issued for related Application No. PCT/IB2019001014 dated Apr. 1, 2021 (10 Pages).
Chinese Patent Office Action for Application No. 201980062679.8 Jun. 27, 2023 (16 pages with English translation).
International Search Report for corresponding International Application No. PCT/SG2019/050483 mailed Dec. 9, 2019.
Non-Final Office Action issued for the corresponding U.S. Appl. No. 17/278,127, dated Jun. 7, 2024, 21 pages (For informational purposes only).
U.S. Office Action issued for the corresponding U.S. Appl. No. 17/278,127, dated Dec. 5, 2024, 21 pages (for informational purposes only).
US Non-Final Office Action issued for the corresponding U.S. Appl. No. 17/278,127, dated Mar. 13, 18 pages (For informational purposes only).

* cited by examiner

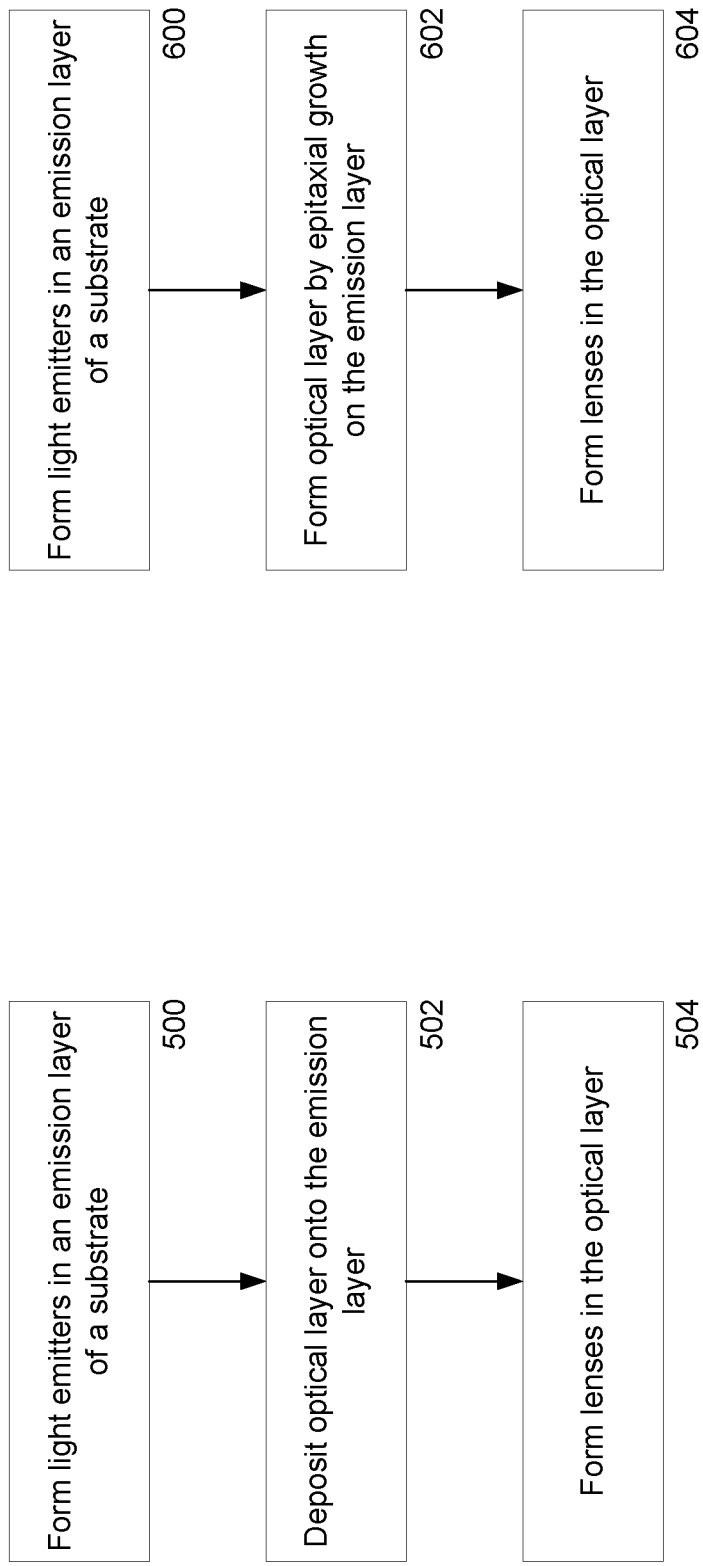

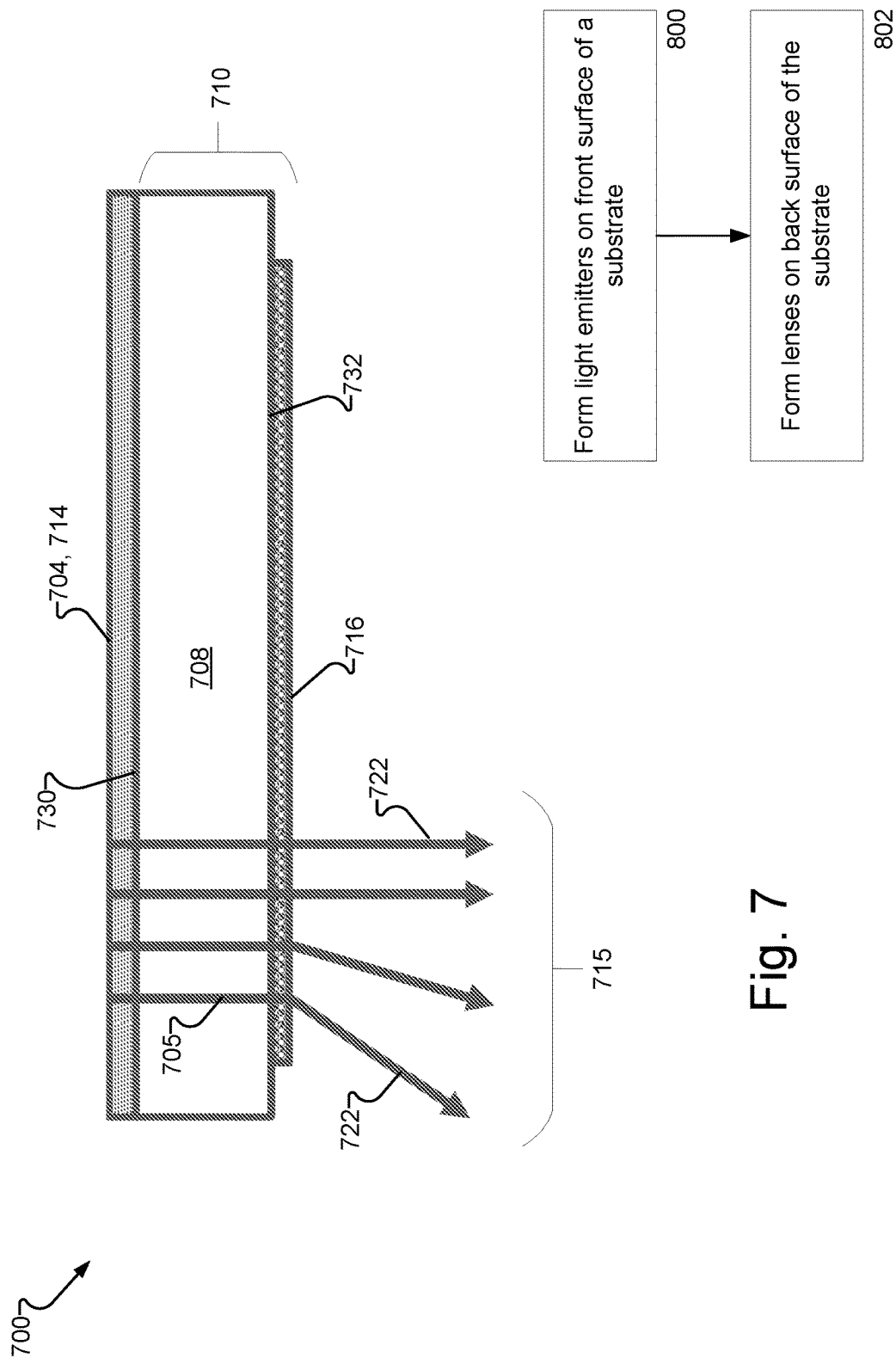

PRODUCING ILLUMINATION BEAMS USING MICRO-LENS ARRAYS

BACKGROUND

Micro-lens arrays are arrays of small lenses that can be used in conjunction with light emitters, such as semiconductor-based light emitters, to form compact imaging devices.

SUMMARY

In an aspect, a device includes an illumination device for emitting an illumination beam. The illumination device includes an emitter array including multiple light emitters; and a micro-lens array (MLA) including multiple micro-lenses. The MLA is positioned to receive light emitted from the emitter array. Light from the MLA forms the illumination beam. A first region of the MLA is offset from the emitter array by a first offset amount, and a second region of the MLA is offset from the emitter array by a second offset amount different than the first offset amount.

Embodiments can include one or more of the following features.

The light emitters include vertical cavity surface emitting lasers (VCSELs).

The device includes a substrate. The emitter array is formed in an emission layer of the substrate. The device includes an optical layer disposed on the substrate. The MLA being formed in the optical layer.

The optical layer is disposed on the emission layer of the substrate.

The optical layer includes an epitaxial semiconductor.

The optical layer includes a polymer film.

The emission layer is on a first surface of the substrate. The optical layer is disposed on a second surface of the substrate opposite the first surface.

The substrate is at least partially transparent to the light emitted from the emitter array.

The optical layer has a refractive index of at least 1.5.

Each light emitter emits a single beam of light. A divergence of the illumination beam is greater than a divergence of each of the single beams of light emitted from the light emitters.

The divergence of the illumination beam is between about 20° and about 180°, e.g., between about 60° and about 70°.

The divergence of the illumination beam in a first direction is different than the divergence of the illumination beam in a second direction. For instance, the divergence of the illumination beam in the first direction is between about 50° and about 60° and the divergence of the illumination beam in the second direction is between about 60° and about 70°.

Each of the micro-lenses at least partially overlaps a corresponding one of the light emitters, e.g., multiple corresponding light emitters.

At least one of the micro-lenses is configured to deflect the light received from a corresponding light emitters.

Each region of the MLA is positioned to receive light from a corresponding subset of the light emitters and to output a corresponding sub-beam. A first sub-beam output from the first region of the MLA has a different angle of deflection than a second sub-beam output from the second region of the MLA.

The first and second regions of the MLA are positioned such that the first sub-beam overlaps with the second sub-beam at the full width at half maximum (FWHM) points of the first and second sub-beams.

The illumination device includes an illumination device of a mobile computing device.

The illumination device includes a LIDAR device.

The device includes a vehicle and the illumination device includes a LIDAR device for the vehicle.

The LIDAR device includes a component of a three-dimensional mapping system.

In an aspect, a method of making an illumination device includes forming an emitter array in an emission layer of a substrate. The emitter array includes multiple light emitters. The method includes forming an optical layer on the substrate, including forming an MLA including multiple micro-lenses in the optical layer. Forming the MLA includes forming the MLA such that a first region of the MLA is offset from the emitter array by a first offset amount, and a second region of the MLA is offset from the emitter array by a second offset amount different than the first offset amount.

Embodiments can have one or more of the following features.

Forming the optical layer on the substrate includes depositing the optical layer on the substrate; and forming the MLA in the deposited optical layer.

Depositing the optical layer on the substrate includes depositing a polymer film on the substrate.

Depositing a polymer film on the substrate includes depositing a polymer film having a refractive index of at least 1.5.

Forming the optical layer on the substrate includes epitaxially growing the optical layer on the substrate; and forming the MLA in the epitaxially grown optical layer.

Forming the optical layer on the substrate includes forming the optical layer on the emission layer of the substrate.

The emission layer is on a first surface of the substrate. Forming the optical layer on the substrate includes forming the optical layer on a second surface of the substrate opposite the first surface.

Forming the MLA includes forming the MLA such that each of the micro-lenses at least partially overlaps a corresponding one of the light emitters.

Forming the emitter array and the MLA include forming the emitter array and the MLA using semiconductor fabrication processes.

In an aspect, a method for producing an illumination beam includes emitting light from each of multiple light emitters in an emitter array. The method includes, at a first region of an MLA including multiple micro-lenses, receiving light from a first subset of the light emitters and outputting a first sub-beam having a first angle of deflection. The method includes, at a second region of the MLA, receiving light from a second subset of the light emitters and outputting a second sub-beam having a second angle of deflection different from the first angle of deflection. The method includes combining the first sub-beam and the second sub-beam to produce the illumination beam.

Embodiments can have one or more of the following features.

Each light emitter emits a single beam of light. A divergence of the illumination beam is greater than a divergence of each of the single beams of light emitted from the light emitters.

The divergence of the illumination beam is between about 20° and about 180°.

The divergence of the illumination beam in a first direction is different than the divergence of the illumination beam in a second direction.

The illumination beam includes an illumination beam of a mobile computing device.

The illumination beam includes an illumination beam of a LIDAR device.

In an aspect, a 3-D imaging system includes an illumination device in accordance with any of the illumination devices described herein, the illumination device being configured to illuminate an object with a pattern of light. The 3-D imaging system includes a sensor configured to receive reflected light from the illuminated object; and one or more computing devices configured to determine a 3-D shape of the object based on the reflected light.

Embodiments can include one or more of the following features.

The sensor includes a camera.

The one or more computing devices are configured to determine a 3-D mapping of an area based on the reflected light.

The one or more computing devices are configured to perform a facial recognition process based on the determined 3-D shape of the object.

The illumination devices described here can have one or more of the following advantages. Divergent, substantially uniform illumination beams can be produced in compact illumination devices, e.g., illumination devices compatible with thin packaging, e.g., packaging less than 0.5 mm in thickness. The illumination devices can be fabricated in a single set of fabrication processes, e.g., using semiconductor and thin film processing techniques, enabling straightforward and inexpensive manufacture of the illumination devices.

BRIEF DESCRIPTION OF DRAWINGS

FIGS. 5 and 6 are flow charts.
FIG. 7 is a diagram of an illumination device.
FIG. 8 is a flow chart.

DETAILED DESCRIPTION

We describe here a compact illumination device for producing an illumination beam with a broad divergence and a substantially uniform intensity and low variation in power across its width. The illumination device includes an array of light emitters, such as vertical-cavity surface-emitting lasers (VCSELs), and a micro-lens array to receive and deflect the light emitted by the light emitters. Regions of the micro-lens array are differently offset relative to the array of light emitters, resulting in the generation of multiple sub-beams with different angles of deflection. The multiple sub-beams combine to form the divergent illumination beam.

Figure 1A:
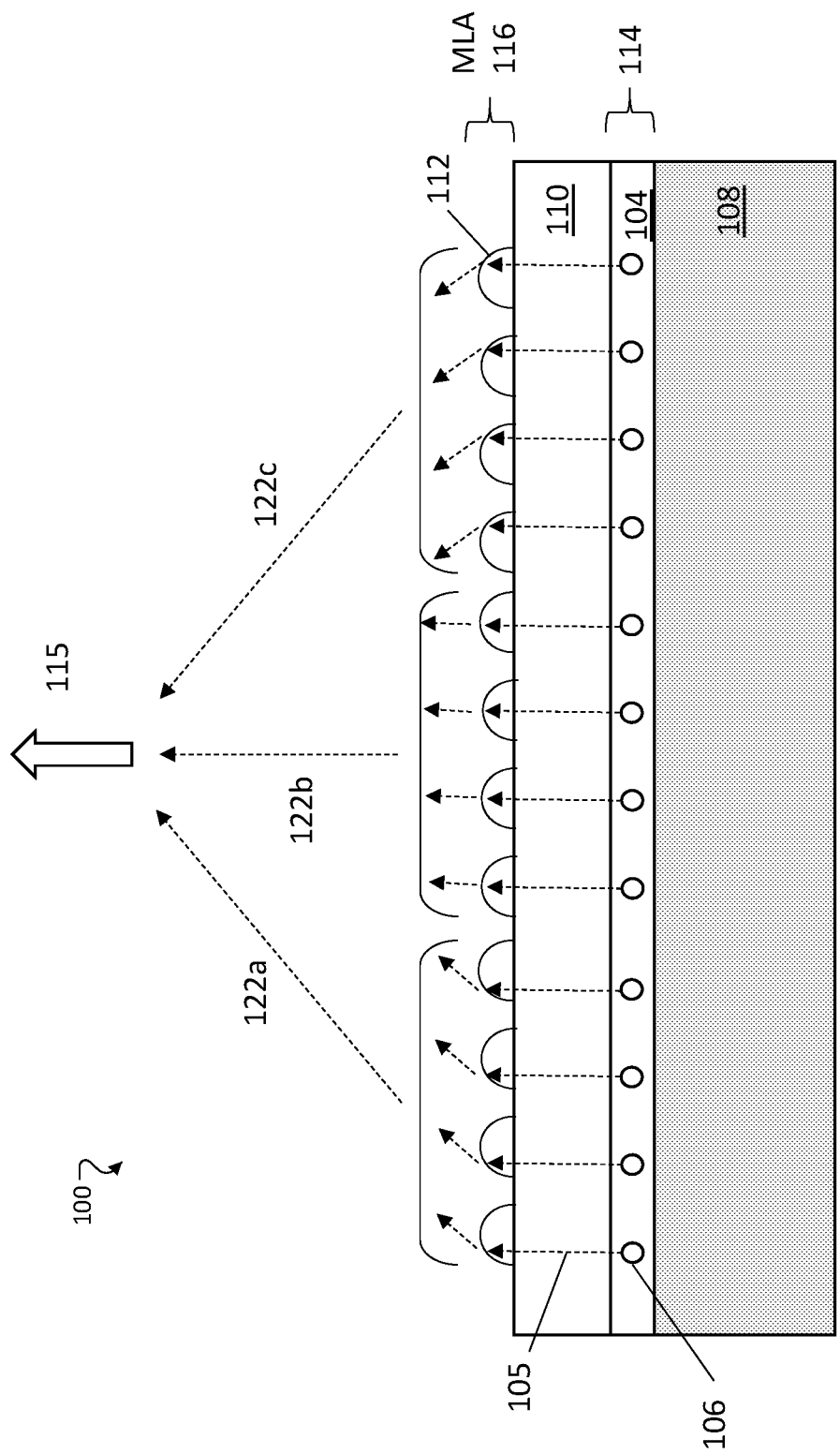
FIGS. 1A and 1B are diagrams of an illumination device.

Referring to FIG. 1A, an illumination device 100 for producing a divergent illumination beam 115 includes an emission layer 104 that includes semiconductor-based light emitters 106, such as semiconductor lasers, e.g., VCSELs or side-emitting semiconductor lasers; or diodes, such as laser diodes or light emitting diodes (LEDs). Each light emitter 106 emits light 105, such as a light beam, e.g., visible light, infrared light, or ultraviolet light. The emission layer 104 can be formed on a substrate 108, such as a portion of a semiconductor wafer, e.g., a silicon wafer, gallium arsenide (GaAs) wafer, aluminum gallium arsenide (AlGaAs), indium phosphide (InP), or other type of wafer.

An optical layer 110 including lenses 112 or other optical elements is disposed on the emission layer 104. For instance, the optical layer 110 can be a thin film deposited or grown (e.g., epitaxially grown) on the emission layer 104 (as shown in FIG. 1) or can be a portion of the substrate 108 in which the lenses 112 are formed. The thin film nature of the optical layer enables the illumination device 100 to be compact. The optical layer 110 is formed of a material that is at least partially transparent to the light 105 emitted by the light emitters 106. For instance, the optical layer 110 can be a transparent polymer, such as benzocyclobutene (BCB, also known as cyclopentane) (Dow Chemical) or HD8910 (DuPont); or a transparent semiconductor, such as GaAs.

The lenses 112 are positioned to receive and deflect at least some of the light 105 emitted by the light emitters 106, forming a single illumination beam 115 from the illumination device 100. The illumination beam 115 can be a broad angle illumination beam having a divergence greater than the divergence of the light 105 emitted by the light emitters 106. For instance, the divergence at full width at half maximum (FWHM) of the light 105 emitted by the light emitters 106 can be about 10-20 degrees, and the divergence at FWHM of the illumination beam 115 can be about 20-180 degrees, e.g., about 50-90 degrees, e.g., about 60-70 degrees. In some examples, the divergence of the illumination beam 115 can vary by direction. For instance, the divergence of the illumination beam 115 in a first direction can be about 50-60 degrees, e.g., about 55 degrees, and the divergence of the illumination beam 115 in a second direction (e.g., perpendicular to the first direction) can be about 60-70 degrees, e.g., about 65 degrees.

The greater divergence of the illumination beam 115 can be achieved by arranging the lenses 112 such that the positioning of the lenses 112 relative to the light emitters 106 varies across the illumination device 100. As discussed further below, the different relative positioning between the lenses 112 and the light emitters 106 results in the creation of multiple sub-beams 122, each sub-beam having a different angle of deflection. The multiple sub-beams combine into the single illumination beam 115, with the broad divergence of the illumination beam 115 being enabled by the differing angles of deflection of the constituent sub-beams.

Figure 1B:
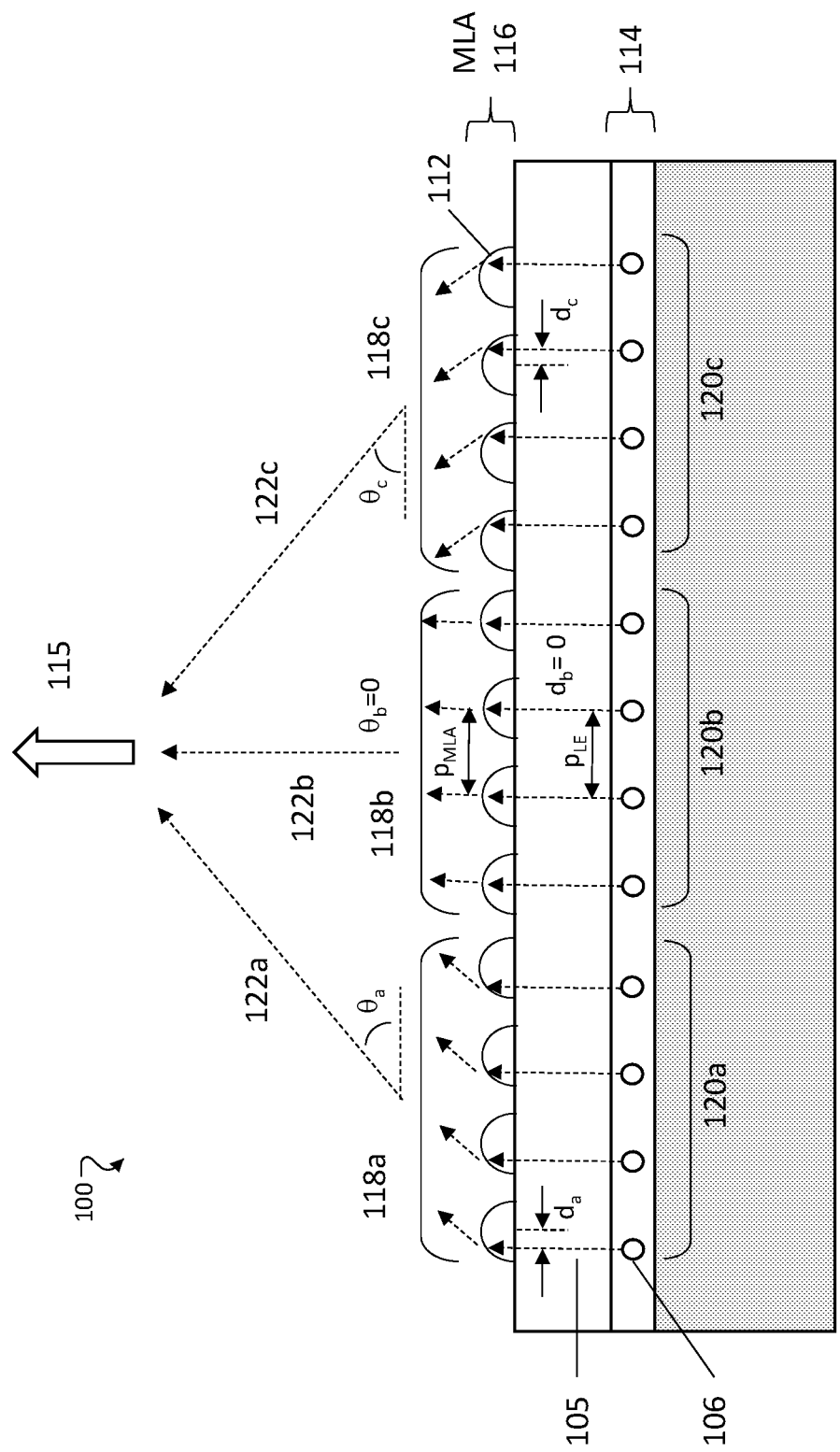

In some examples, the light emitters 106 are arranged in an array 114, such as a one-dimensional array or a two-dimensional array, such as a square array, a rectangular array, a hexagonal array, or an array of another geometry. The lenses 112 are arranged in an array 116, sometimes referred to as a micro-lens array (MLA) 116. The MLA 116 can be a one-dimensional array (as shown in FIG. 1) or a two-dimensional array, such as a square array, a rectangular array, a hexagonal array, or an array of another geometry. In the example of FIG. 1A, the array 114 of light emitters 106 is a one-dimensional array of pitch $p_{LE}$ and the MLA 116 is a one-dimensional array of pitch $p_{MLA}$ (see FIG. 1B). The pitch $p_{MLA}$ of the MLA 116 and the pitch $p_{LE}$ of the array 114 of light emitters can be equal to or larger than a diameter of the lenses 112 in the MLA 116.

FIG. 1B is an annotated view of the illumination device 100 of FIG. 1. The MLA 116 has multiple regions 118a, 118b, 118c (referred to collectively as regions 118), with the lenses 112 in each region 118a, 118b, 118c positioned to receive light from a corresponding subset 120a, 120b, 120c of the light emitters 106. Each of the regions 118a, 118b, 118c is offset from the corresponding subset 120a, 120b, 120c of the light emitters 106 by an offset $d_a$, $d_b$, $d_c$. An offset between a region 118 of the MLA 116 and a corresponding subset 120 of the light emitters is the lateral distance between the center of a lens and the center of the corresponding light emitter. The offset of at least one of the regions 118 is different from the offsets of the other regions. In some examples, all of the offsets $d_a$, $d_b$, $d_c$ are different. In some examples, at least one of the offsets is zero, meaning that there is no offset between one of the regions of the MLA 116 (here, region 118b) and the corresponding subset 120b of the light emitters 106. We sometimes refer to an MLA 116 in which at least one region 118 is offset from the corresponding subset 120 of light emitters 106 as being an MLA that is offset from the array of light emitters. The offset between the MLA 116 and the array 114 of light emitters can be such that each of the lenses 112 in the MLA 116 at least partially overlaps a corresponding light emitter 106 (as shown in FIG. 1B), or at least partially overlaps multiple corresponding light emitters 106.

The lenses 112 in the MLA 116 deflect the light 105 emitted by the light emitters 106 to form the illumination beam 115. The angle of deflection $\theta$ of each sub-beam depends at least on the offset between the MLA 116 and the array 114 of light emitters 106. When different regions 118 of the MLA 116 have different offsets, each region 118a, 118b, 118c deflects the light 105 emitted by the corresponding subset 120a, 120b, 120c of light emitters 106 differently, forming sub-beams 122a, 122b, 122c (collectively referred to as sub-beams 122) each directed at a different angle of deflection $\theta_a$, $\theta_b$, $\theta_c$. Each sub-beam 122 has a more uniform intensity and less power variation across the width of the sub-beam than the constituent beams 105 emitted by the light emitters.

The sub-beams 122 combine to form the illumination beam 115. The different angles of deflection of the sub-beams 122 produce a broadly divergent illumination beam 115 with a substantially uniform intensity and with little variation in power across its width. The illumination beam 115 can also have a relatively steep rollover at the edges of the beam.

The angle of deflection $\theta$ at which the sub-beams 122 are directed is dependent on the offset between the regions 118 of the MLA 116 and the corresponding subsets 120 of light emitters 106. The angle of deflection is also dependent on the index of refraction of the optical layer 110. A higher index of refraction enables a larger angle of deflection to be achieved. In some examples, the optical layer 110 can have a refractive index of at least 1, e.g., between about 1 and about 1.8, e.g., between about 1.5 and about 1.8.

In some examples, each sub-beam 122 is individually controllable, e.g., by addressing the corresponding subset 120 of light emitters 106, enabling control over the configuration of the resulting illumination beam.

In a specific example, the light emitters 106 are VCSELs having a diameter of 7.5 μm and arranged in an array 114 with a pitch of 28 μm (e.g., the center-to-center distance of adjacent VCSELs is 28 μm). The lenses 112 in the MLA 116 have a diameter of 25 μm and a height of 8 μm. Each lens 112 in the MLA 116 is offset from its corresponding VCSEL by an offset of 8.5 μm. In general, the offset between lenses 112 and corresponding light emitters can be less than about 10 μm, e.g., about 5-10 μm. A larger offset increases the angle of deflection of the sub-beam.

Figure 2:
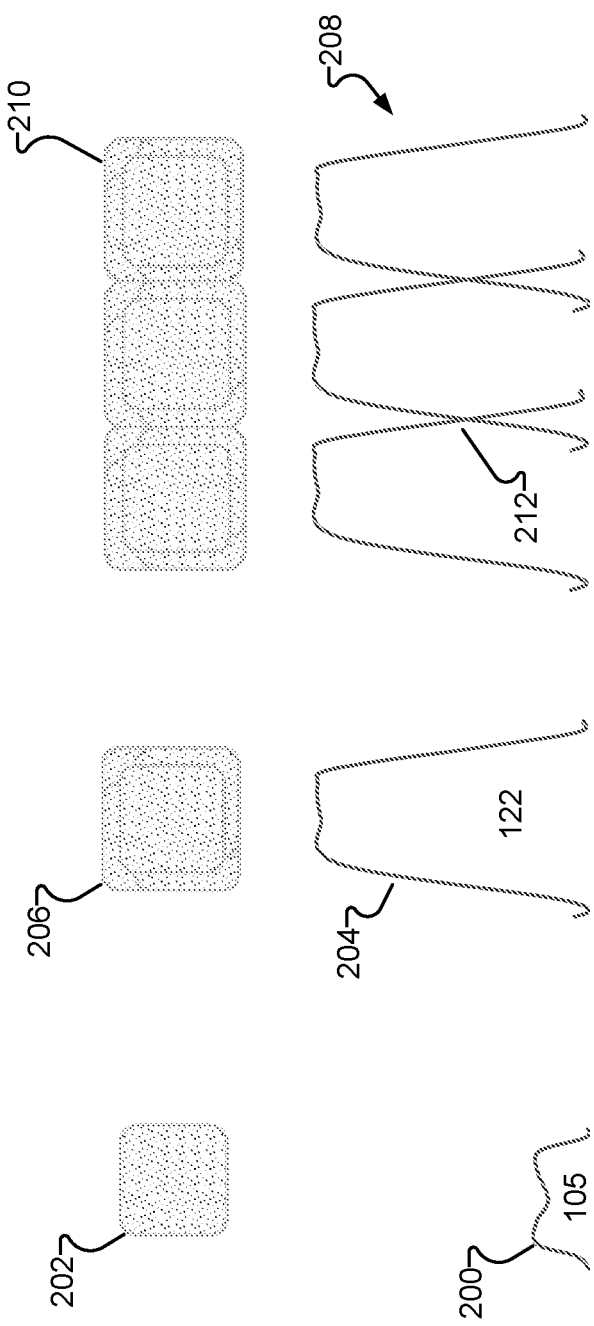
FIG. 2 is a diagram of profile and top views of beams.

Referring also to FIG. 2, in an example, the beam 105 emitted by a single light emitter 106 of the illumination device 100 has a tophat square beam profile 200, shown also from a top view 202. A single region 118 of the MLA 116 deflects light from its corresponding subset 120 of light emitters 106 to form the sub-beam 122, which has a profile 204 (shown also from a top view 206) with substantially uniform intensity and with little power variation across the width of the beam. The angle of deflection of the sub-beam 122a depends at least on the offset d between the region 118 of the MLA 116 and the corresponding subset 120 of light emitters 106.

The illumination beam 115 is formed by the combination of the multiple sub-beams 122a, 122b, 122c, each directed at a different angle of deflection. For instance, the sub-beams 122 can be deflected such that adjacent sub-beams 122 overlap at their FWHM point 212, forming the illumination beam 115. The illumination beam 115 is shown in profile 208 and from a top view 210. The formation of the illumination beam 115 from the multiple, differently deflected sub-beams 122 makes the illumination beam 115 a divergent beam, e.g., with a divergence at FWHM of about 20-180 degrees, e.g., about 50-90 degrees, e.g., about 60-70 degrees. The illumination beam can have a substantially uniform intensity with little power variation across the width of the beam, and can have a relatively steep rollover at edges of the beam.

Figure 3B:
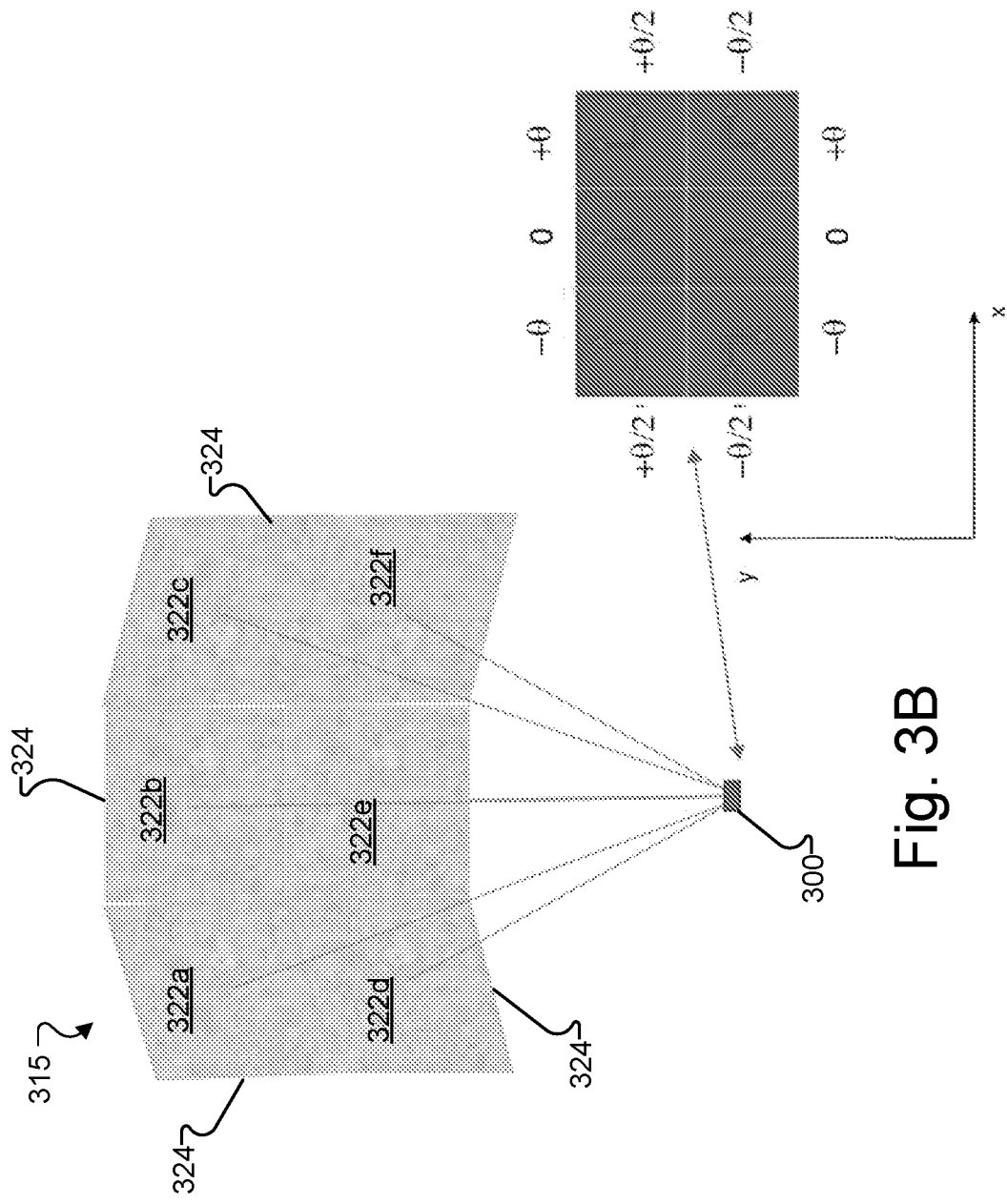
FIGS. 3A and 3B are diagrams of beams.
Figure 3A:
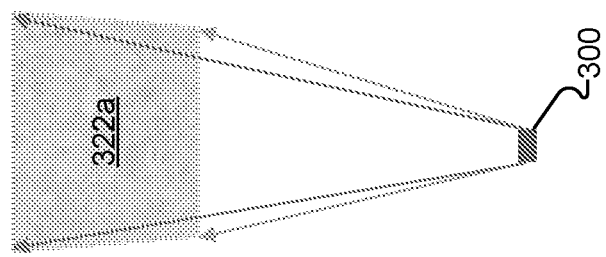

Referring to FIGS. 3A and 3B, in an example, an illumination device 300 has a two-dimensional MLA that is offset from a two-dimensional array of light emitters. A single region of the two-dimensional MLA deflects light from its corresponding subset of light emitters to form a sub-beam 322a. The sub-beam 322a is a relatively divergent beam with a substantially uniform intensity and little variation in power across the width of the sub-beam.

Multiple regions of the two-dimensional MLA each deflects light at a different angle of deflection, forming multiple sub-beams 322a-322f (collectively referred to as sub-beams 322). The sub-beams 322 combine to form an illumination beam 315, which is a divergent beam with a substantially uniform intensity and little variation in power across the width of the beam, and has a relatively steep rollover at edges 324 of the beam.

In the example of FIG. 3B, the illumination beam 315 is formed six sub-beams 322 in a 3×2 rectangular arrangement. To form such an illumination beam 315, the regions of the two-dimensional MLA are offset from their corresponding subsets of light emitters such that adjacent sub-beams overlap at their FWHM point. Specifically, the sub-beams 322 are offset in the y direction by an angle of either $-\theta/2$ or $+\theta/2$, and in the x direction by an angle of $-\theta$, 0, or $+\theta$, where $\theta$ is the divergence of each sub-beam 322.

Figure 4:
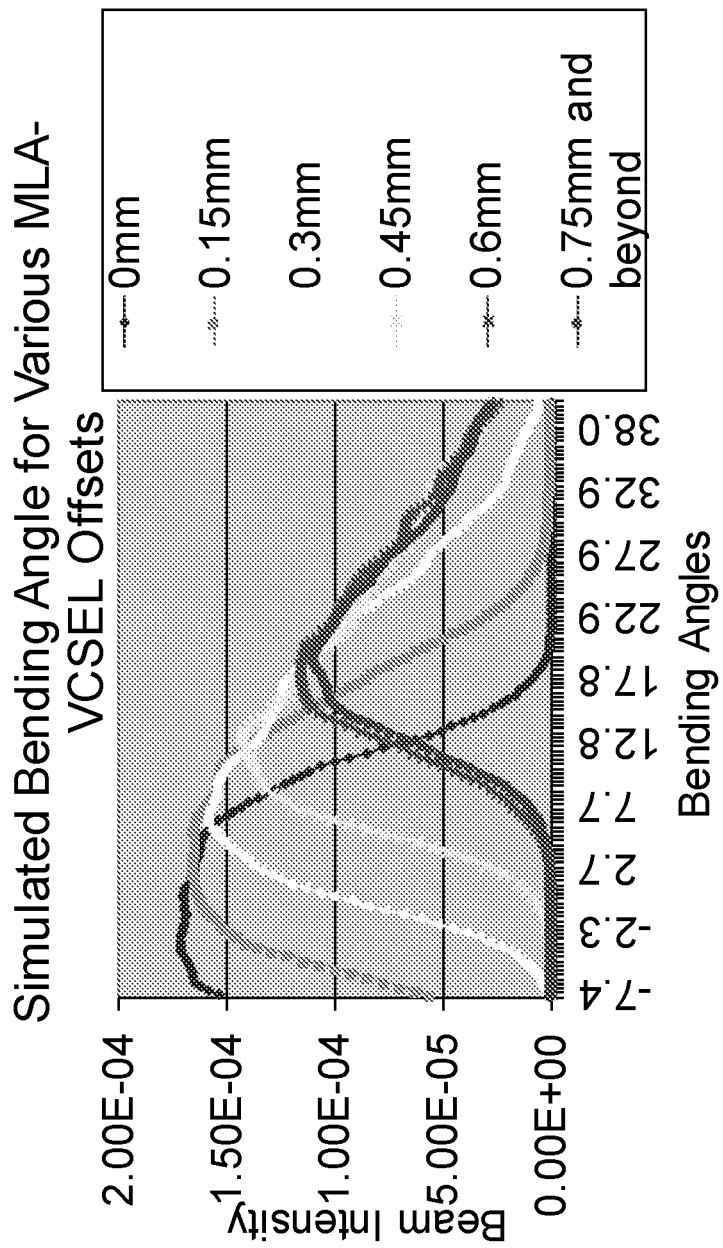
FIG. 4 is a plot of beam intensity versus deflection angle for various offsets.

Referring to FIG. 4, in a specific example, the intensity of an illumination beam emitted from a VCSEL array coupled to an MLA is shown relative to the bending angle (e.g., the angle of deflection) of the beam for various offsets between the VCSEL array and the MLA. As can be seen from FIG. 4, as the offset between the VCSEL array and the MLA increases, the peak intensity of the illumination beam shifts to larger bending angles, indicating the beam deflection caused by the offset.

FIG. 5 is a flow chart of a process for fabrication of an illumination device such as the illumination device 100 of FIG. 1, in which the optical layer is a thin film deposited onto the surface of the emission layer.

Light emitters, such as VCSELs, side emitting semiconductor lasers, laser diodes, or other types of light emitters, are formed in an emission layer of a substrate, such as a semiconductor substrate, e.g., a GaAs wafer (500). For instance, the emission layer can be a top layer of the substrate, and the light emitters can be formed by processing the substrate using semiconductor fabrication techniques, including thin film deposition, lithography, oxide growth, and etching processes. In some examples, at least a portion of the emission layer can be epitaxially grown onto the surface of the substrate.

The optical layer of the illumination device is formed by depositing a thin film of a transparent material onto the surface of the emission layer (502). The transparent material is a material that is transparent to the wavelength of light at which the light emitters are configured to emit light. In some examples, the thin film can be a polymer film deposited by a polymer thin film deposition technique, e.g., by spin coating, roll coating, plasma or vapor deposition, or other thin polymer film deposition technique. The polymer film can be cured after deposition. In some examples, the thin film can be an oxide film, such as a silicon oxide film, deposited by a thin film deposition technique such as plasma or vapor deposition. In some examples, the thin film can be processed following deposition to generate a flat surface. The thin film can have a thickness of less than 20 µm, e.g., less than 10 µm, e.g., between about 3 µm and about 8 µm.

Lenses are formed in the optical layer (504) using thin film patterning techniques. For instance, when the thin film is a polymer thin film, a layer of photoresist can be deposited onto the polymer thin film exposed in a pattern of squares or rectangles, with regions of the squares or rectangles being offset by a desired amount from the light emitters in the underlying emission layer. The exposed photoresist can be heated to melt the mesas into dome shapes, and the polymer film can be etched, e.g., by reactive ion etching, through the photoresist to form dome-shaped lenses. When the thin film is an oxide film, the lenses can be formed by a similar lithography and etching processes.

FIG. 6 is a flow chart of a process for fabrication of an illumination device such as the illumination device 100 of FIG. 1, in which the optical layer is an epitaxially grown layer, e.g., a layer of a semiconductor such as GaAs, AlGaAs, or another semiconductor, that is epitaxially grown onto the emission layer.

Light emitters, such as VCSELs, side emitting semiconductor lasers, laser diodes, or other types of light emitters, are formed in an emission layer of a substrate, such as a semiconductor substrate, e.g., a GaAs wafer (600) using semiconductor fabrication techniques.

The optical layer of the illumination device is formed by epitaxial growth of a transparent material on the surface of the emission layer (602). The transparent material is a material that is transparent to the wavelength of light at which the light emitters are configured to emit light. For instance, the transparent material can be an epitaxial layer of GaAs or AlGaAs. The epitaxial layer can have a thickness of less than about 25 µm, e.g., less than about 20 µm, e.g., between about 10 µm and about 20 µm.

Lenses are formed in the epitaxial optical layer (604) using semiconductor fabrication processes including lithography and etching as described above for polymer or oxide layers. For instance, the lenses can be positioned at desired offsets from the light emitters of the underlying emission layer.

An illumination device having an epitaxially grown optical layer can be resistant to moisture or chemical damage, improving the reliability of the illumination device. In some examples, epitaxially grown layers can be formed of materials with relatively high refractive indices; an MLA formed in an epitaxially grown optical layer can effect a large angle of deflection, thereby producing an illumination beam with a wide divergence.

Referring to FIG. 7, in an example illumination device 700, an array 714 of light emitters are formed in an emission layer 704 on a front side 730 of a substrate 708. An optical layer 710 includes an MLA 716. The MLA 708 is formed on a back side 732 of the substrate 708 and is offset from the array 714 of light emitters as described with respect to the illumination device of FIG. 1.

In the illumination device 700, the substrate 708 itself forms part of the optical layer 710. The substrate 708 is formed of a material that is transparent to light 705 emitted from the light emitters. For instance, for light emitters emitting light at a wavelength of at least about 950 nm, the substrate 708 can be GaAs. The light 705 emitted from the light emitters is transmitted through the substrate 708 to the MLA 716, and an illumination beam 715 composed of multiple sub-beams 722, each with a different angle of deflection, exits from the back side 732 of the substrate 708.

An illumination device such as the illumination device 700, in which the light emitters and MLA are formed on opposite sides of the substrate, can be resistant to moisture or chemical damage, improving the reliability of the illumination device. In some examples, semiconductor substrates can have relatively high refractive indices; an MLA formed on the back side of such a substrate can effect a large angle of deflection, thereby producing an illumination beam with a wide divergence.

FIG. 8 is a flow chart of a process for fabrication of an illumination device such as the illumination device 700 of FIG. 7, in which the light emitters and MLA are formed on opposite sides of the substrate.

Light emitters, such as VCSELs, side emitting semiconductor lasers, laser diodes, or other types of light emitters, are formed in an emission layer on a front surface of a substrate, such as a semiconductor substrate, e.g., a GaAs substrate (800), using semiconductor fabrication techniques.

Lenses are formed on a back surface of the substrate (802). In some examples, the lenses can be formed by depositing and patterning a polymer thin film or an oxide thin film. In some examples, the lenses can be formed in an epitaxially grown thin film on the back surface of the substrate. In some examples, the lenses can be formed directly on the back surface of the substrate, without growth or deposition of an additional layer. The lenses can be positioned at desired offsets from the light emitters of the underlying emission layer.

Figure 9:
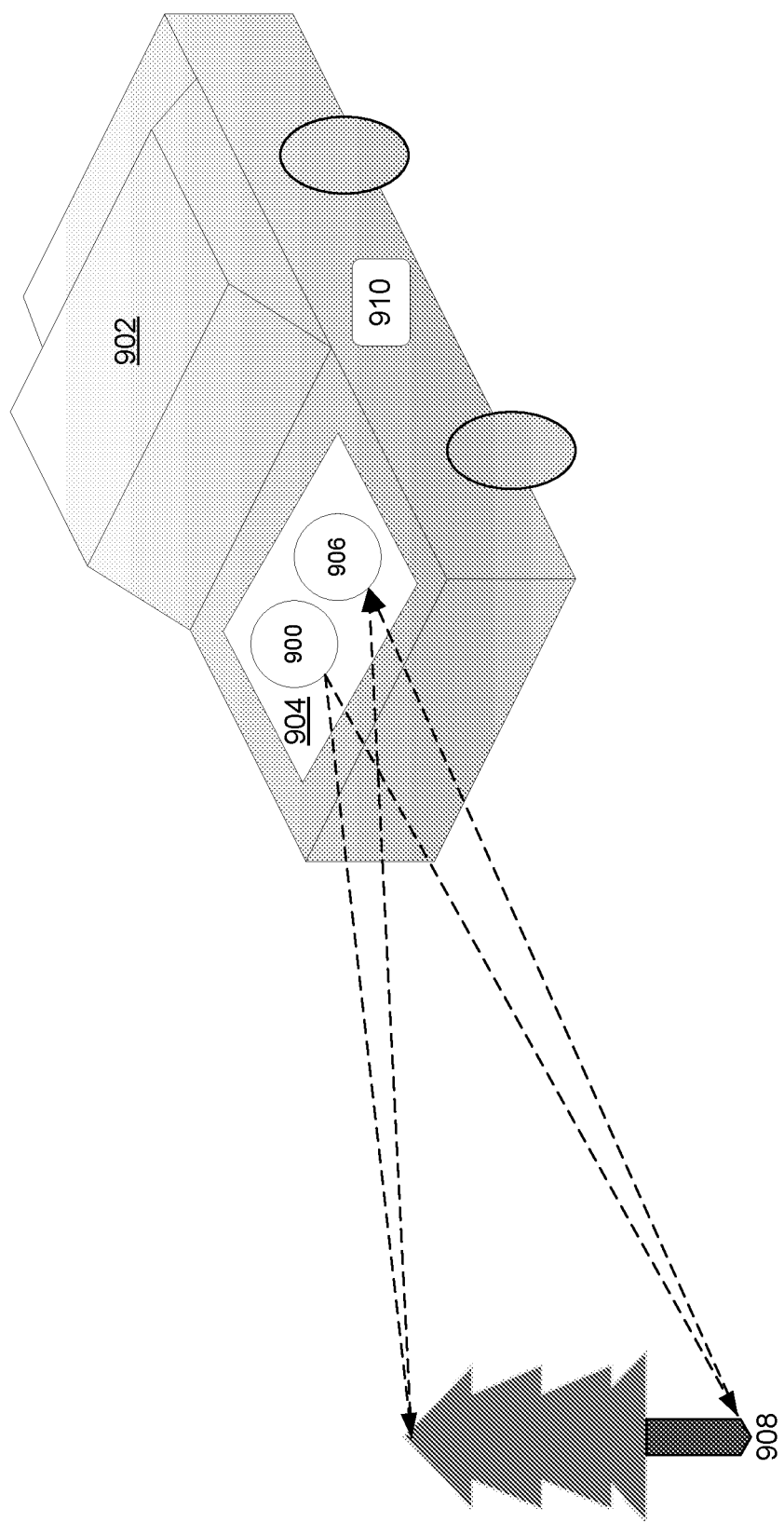
FIG. 9 is a diagram of a vehicle.

Referring to FIG. 9, in some examples, an illumination device 900 such as those described above can be mounted on a vehicle 902, such as a partially-autonomous or fully-autonomous vehicle. The vehicle can be a land-based vehicle (as shown), such as a car or truck; an aerial vehicle, such as an unmanned aerial vehicle; or a water-based vehicle, such as a ship or submarine. The illumination device 900 can be a flood illuminator. In the context of the partially- or fully-autonomous vehicle 902, the illumination device 900 can form part of a remote imaging system 904, such as a LIDAR (Light Detection and Ranging) system, that includes imaging components such as a sensor 906, e.g., a camera, mirror, or scanner. The imaging system 904 including the illumination device 900 can be used, e.g., for three-dimensional (3-D) mapping of the environment of the vehicle 902. For instance, the illumination device 900 can be used to illuminate an object 908, e.g., an object in or near a roadway on which the vehicle 902 is traveling, and the sensor 906 can be used to capture light reflected by the illuminated object 908. A signal based on the reflected light (e.g., a signal generated by a photodetector such as a photodiode) can be provided to a computing device 910, e.g., including one or more processors, that determines a 3-D shape of the object based on the reflected light. By determining the 3-D shapes of various objects, a mapping of an environment of the vehicle can be determined and used to control the partially- or fully-autonomous operation of the vehicle 902.

Figure 10A:
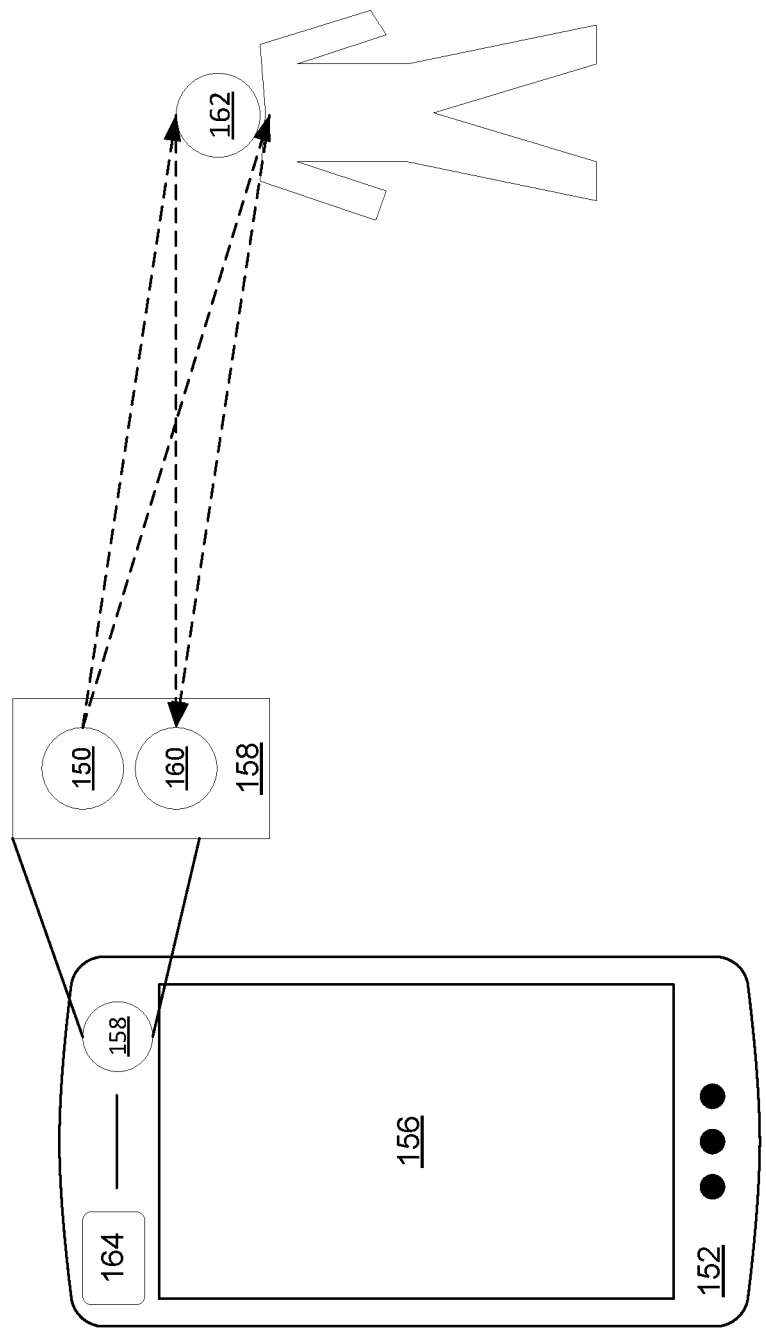
FIGS. 10A and 10B are diagrams of mobile computing devices.

Referring to FIG. 10A, in some examples, an illumination device 150 such as those described above can be mounted on or incorporated into a front side of a mobile computing device 152, such as a mobile phone, a tablet, or a wearable computing device. The front side of the mobile device 152 is the side of the device that includes a screen 156. The illumination device 150 can be a flood illuminator. The illumination device 150 can be incorporated into a front-side imaging system 158 that includes imaging components such as a sensor 160, e.g., a camera, mirror, or scanner. The front-side imaging system 158 including the illumination device 150 can be used for 3-D imaging applications, e.g., for facial recognition. For instance, the structured light illumination device 150 can be used to illuminate a face 162 of a person, and the sensor 160 can be used to capture light reflected by the face 162. A signal based on the reflected light (e.g., a signal generated by a photodetector such as a photodiode) can be provided to one or more processors 164, e.g., in the mobile device 152 or remote, such as cloud-based processors. The one or more processors 164 can perform facial recognition processing based on the light reflected by the face 162.

Figure 10B:
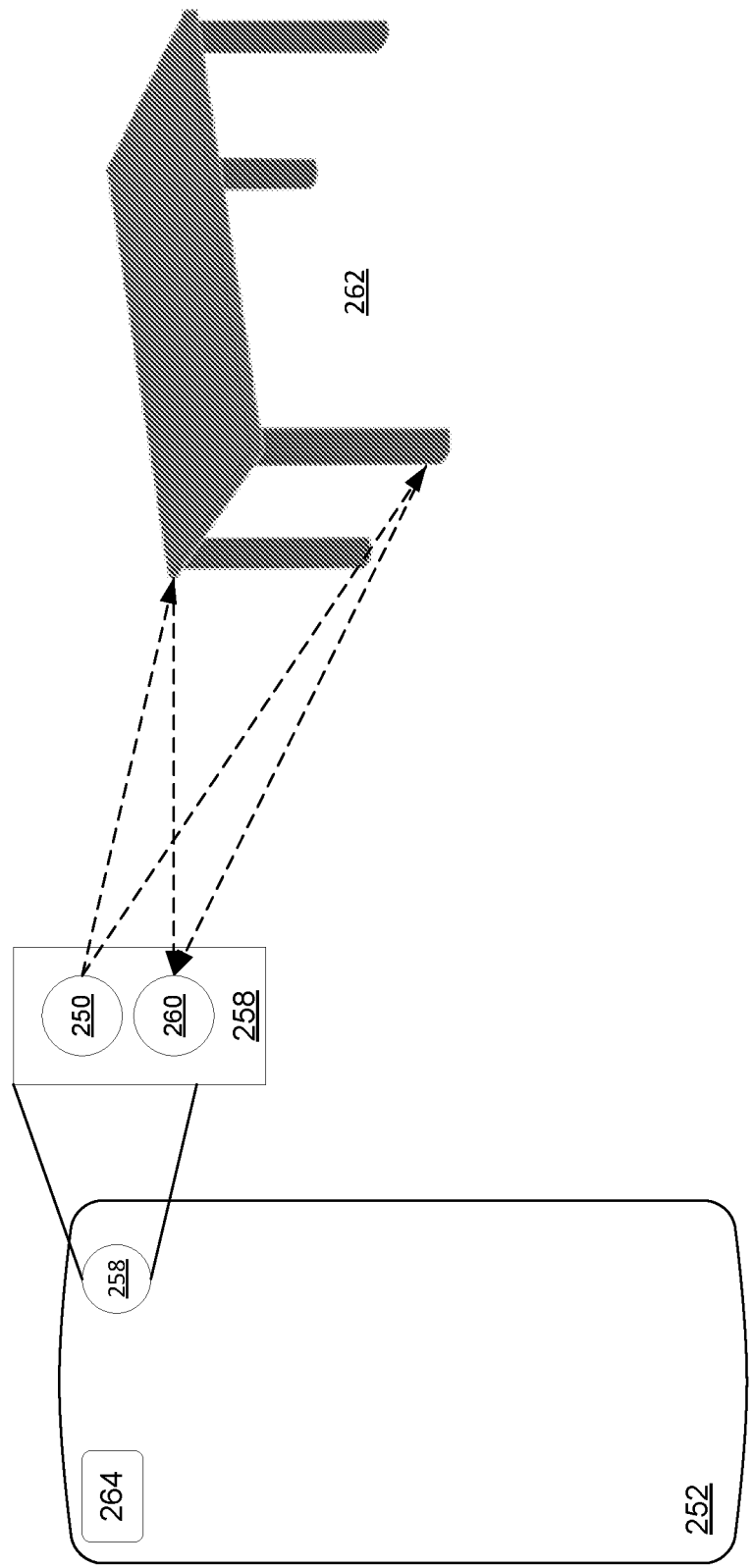

Referring to FIG. 10B, in some examples, an illumination device 250 such as those described above can be mounted on a back side of a mobile computing device 252. The back side is the side of the device opposite the front side, such as the side that does not include a screen. The illumination device 250 can be a flood illuminator. The illumination device 250 can be incorporated into a back-side imaging system 258 that includes imaging components such as a sensor 260, e.g., a camera, mirror, or scanner. The back-side imaging system 258 including the illumination device 250 can be used, e.g., for 3-D imaging applications, e.g., for object recognition or for environmental mapping, such as mapping of a room. For instance, the illumination device 250 can be used to illuminate an object 262 in a room or other environment, and the sensor 260 can be used to capture light reflected by the object 262. A signal based on the reflected light (e.g., a signal generated by a photodetector such as a photodiode) can be provided to one or more processors 264, e.g., in the mobile device 252 or remote, such as cloud-based processors. The one or more processors 264 can determine a 3-D shape of the object based on the reflected light. The determined 3-D shape can be used by the one or more processors 264 to perform object recognition processing, or can be used in combination with determined 3-D shapes of one or more other objects to develop a 3-D mapping of the room.

An illumination device such as those described above can further be used to generate an illumination beam for generating time-of-flight data. In this example, the MLA is arranged such that the illumination beam has a larger intensity around the periphery of the illuminated area. The larger intensity can be achieved by covering a larger number of light emitters by those lenses which direct the light towards the periphery than the light emitters covered by lenses which direct the light towards the centre of the illuminated area. Instead of, or in addition to, using a larger number of emitters to achieve a higher intensity, individual emitters with a higher intensity of emitted light can be used. Other non-uniform beam intensity profiles can be achieved by arranging the MLA accordingly.

The illumination device such as described above comprises a plurality of light emitters which can be controlled independently. Different parts of the array, or even individual light emitters can be switched on or off selectively and independent from other parts of the array or independent from other individual light emitters. Different parts of a target illumination area can thereby be illuminated selectively.

The embodiment illustrated in FIGS. 1A and 1B comprises different subsets of micro-lens arrays. The offset between the micro-lenses with respect to the central light emitting axis of the light emitters is the same within each subset, such as within subsets 120a, 120b and 120c, but different between those different subsets. In an alternative embodiment, a particular offset is duplicated at least once across the substrate outside the initial subset. For example, the substrate of FIG. 1A with three subsets can instead be arranged as a substrate with six subsets, formed by duplicating the initial three subsets adjacent a first set of three subsets. Alternatively, the three types of offsets illustrated in FIG. 1A can be distributed randomly, quasi-randomly, or periodically. The advantage of distributing particular offsets outside a single subset is that the overall light output is more robust against damage such as scratching or dirt. If a piece of dust occludes one of the MLA subsets in the FIG. 1A embodiment, then the portion of the illumination beam corresponding to that MLA subset will be obstructed thereby causing a non-uniform reduction in illumination beam intensity. However, in the alternative embodiment where the offsets are distributed more evenly, then a piece of dust would only cause a uniform reduction of intensity, or at least more uniform than the FIG. 1A embodiment.

The embodiments discussed previously comprise an emitter array, such as array 114, whereby the distance between emitters in the emitter array is constant with micro-lenses which are offset with respect to the central light emitting axis of the emitters. Alternatively, the micro-lenses can be distributed uniformly, while the emitters are offset with respect to the central optical axis of the micro-lenses. Alternatively, both the emitter array and the micro-lens array have an array spacing which is not constant, while the relative offset between the central light emitting axis of each emitter relative to the optical axis of each micro-lens is chosen to achieve the desired beam profile.

A number of embodiments have been described. Nevertheless, it will be understood that various modifications may be made without departing from the scope of the invention. For example, some of the steps described above may be order independent, and thus can be performed in an order different from that described.

Other implementations are also within the scope of the following claims.

What is claimed is:

1. A device comprising:
   an illumination device for emitting an illumination beam, the illumination device comprising:
      a substrate;
      an emitter array comprising multiple light emitters, wherein the emitter array is positioned in an emission layer of the substrate;
      an optical layer transparent to the wavelength of light at which the light emitters are configured to emit light, wherein the optical layer is epitaxially grown onto the emission layer of the substrate, wherein the optical layer comprises GaAs or AlGaAs, wherein the optical layer has a thickness of more than 10 µm and less than 20 µm; and a micro-lens array (MLA) comprising multiple micro-lenses configured to deflect light of the multiple light emitters, the MLA being positioned to receive light emitted from the emitter array, wherein the MLA is positioned in the optical layer, wherein the multiple micro-lenses of the MLA are arranged at different offsets to the corresponding multiple light emitter such that sub-beams are formed with adjacent sub-beams overlapping at their FWHM point and forming an illumination beam having a uniform intensity and a steep rollover at the edges of the illumination beam.

2. The device of claim 1, in which the light emitters comprise vertical cavity surface emitting lasers (VCSELs).

3. The device of claim 1, in which the optical layer has a refractive index of at least 1.5.

4. The device of claim 1, in which each light emitter emits a single beam of light, and in which a divergence of the illumination beam is greater than a divergence of each of the single beams of light emitted from the light emitters.

5. The device of claim 4, in which the divergence of the illumination beam is between 20° and 180°.

6. The device of claim 5, in which the divergence of the illumination beam is between 60° and 70°.

7. The device of claim 4, in which the divergence of the illumination beam in a first direction is different than the divergence of the illumination beam in a second direction.

8. The device of claim 7, in which the divergence of the illumination beam in the first direction is between 50° and 60° and the divergence of the illumination beam in the second direction is between 60° and 70°.

9. The device of claim 1, in which each of the micro-lenses at least partially overlaps a corresponding one of the light emitters.

10. The device of claim 9, in which each of the micro-lenses at least partially overlaps multiple corresponding light emitters.

11. The device of claim 1, wherein a first sub-beam output from a first region of the MLA has a different angle of deflection than a second sub-beam output from a second region of the MLA.

12. The device of claim 1, in which the illumination device comprises an illumination device of a mobile computing device.

13. The device of claim 1, in which the illumination device comprises a LIDAR device.

14. The device of claim 13, in which the device comprises a vehicle and the illumination device comprises a LIDAR device for the vehicle.

15. The device of claim 13, in which the LIDAR device comprises a component of a three-dimensional mapping system.

16. A 3-D imaging system comprising:
an illumination device in accordance with claim 1, the illumination device being configured to illuminate an object with a pattern of light;
a sensor configured to receive reflected light from the illuminated object; and
one or more computing devices configured to determine a 3-D shape of the object based on the reflected light.

17. The 3-D imaging system of claim 16, in which the sensor comprises a camera.

18. The 3-D imaging system of claim 16, in which the one or more computing devices are configured to determine a 3-D mapping of an area based on the reflected light.

19. The 3-D imaging system of claim 16, in which the one or more computing devices are configured to perform a facial recognition process based on the determined 3-D shape of the object.

20. A method of making an illumination device, comprising:
forming an emitter array in an emission layer of a substrate, the emitter array comprising multiple light emitters; and
forming an optical layer transparent to the wavelength of light at which the light emitters are configured to emit light on the substrate by:
epitaxially growing the optical layer comprising GaAs or AlGaAs on the emission layer of the substrate; and
forming an MLA comprising multiple micro-lenses in the optical layer, wherein the multiple micro-lenses are configured to deflect light of the multiple light emitters,
in which forming the MLA includes forming the MLA such that the multiple micro-lenses of the MLA are arranged at different offsets to the corresponding multiple light emitter forming sub-beams with adjacent sub-beams overlapping at their FWHM point forming an illumination beam having a uniform intensity and a steep rollover at the edges of the divergent illumination beam,
wherein the optical layer has a thickness of more than 10 µm and less than 20 µm.

21. The method of claim 20, in which forming the emitter array and the MLA comprise forming the emitter array and the MLA using semiconductor fabrication processes.

22. A device comprising:
an illumination device for emitting an illumination beam, the illumination device comprising:
a substrate;
an emitter array comprising multiple light emitters, wherein the emitter array is positioned in an emission layer of the substrate;
an optical layer transparent to the wavelength of light at which the light emitters are configured to emit light, wherein the optical layer is epitaxially grown onto the emission layer of the substrate, wherein the optical layer comprises GaAs or AlGaAs, wherein the optical layer has a thickness of more than 10 µm and less than 20 µm; and
a micro-lens array (MLA) comprising multiple micro-lenses configured to deflect light of the multiple light emitters, the MLA being positioned to receive light emitted from the emitter array, wherein the MLA is positioned in the optical layer,
wherein the multiple micro-lenses of the MLA are arranged at offsets to the corresponding multiple light emitter such that sub-beams are formed with adjacent sub-beams overlapping at their FWHM point and forming an illumination beam having a uniform intensity and a steep rollover at the edges of the illumination beam;
wherein the light emitters comprise vertical cavity surface emitting lasers (VCSELs), the VCSELs having a diameter of 7.5 µm and arranged in an array with a pitch of 28 pm;
wherein the multiple lenses in the MLA have a diameter of 25 µm and a height of 8 µm; and
wherein each lens in the MLA is offset from its corresponding VCSEL by an offset of 8.5 µm.

* * * * *